United States Patent [19]
Landin et al.

[11] Patent Number: 5,968,277
[45] Date of Patent: Oct. 19, 1999

[54] SUSCEPTOR APPARATUS FOR EPITAXIAL DEPOSITION AND METHOD FOR REDUCING SLIP FORMATION ON SEMICONDUCTOR SUBSTRATES

[75] Inventors: Trevan Rhett Landin, Amboy, Wash.; James Maxwell Stevenson, Portland, Oreg.

[73] Assignee: SEH America, Inc., Vancouver, Wash.

[21] Appl. No.: 08/949,205

[22] Filed: Oct. 10, 1997

[51] Int. Cl.⁶ .................................................. C23C 16/00
[52] U.S. Cl. ........................................... 118/730; 118/500
[58] Field of Search .................................. 118/728, 729, 118/500, 730, 724

[56] References Cited

U.S. PATENT DOCUMENTS

| | | | |
|---|---|---|---|
| 4,223,048 | 9/1980 | Engle, Jr. .................................... | 427/39 |
| 4,322,592 | 3/1982 | Martin .................................. | 219/10.49 |
| 4,579,080 | 4/1986 | Martin et al. ............................ | 118/500 |
| 4,823,736 | 4/1989 | Post et al. ................................ | 118/730 |
| 5,121,531 | 6/1992 | Severns et al. ......................... | 29/25.01 |
| 5,820,686 | 10/1998 | Moore ...................................... | 118/730 |

FOREIGN PATENT DOCUMENTS

| | | |
|---|---|---|
| 0 210 569 A2 | 2/1987 | European Pat. Off. . |
| 0 590 900 A1 | 4/1994 | European Pat. Off. . |

OTHER PUBLICATIONS

Prior art fig 2.0.

*Primary Examiner*—Bruce Breneman
*Assistant Examiner*—Rudy Zervignon
*Attorney, Agent, or Firm*—Kolisch Hartwell Dickinson McCormack & Heuser

[57] ABSTRACT

Described are apparatus and method for providing relief in a center bottom region of each of a plurality of recessed pockets for supporting a semiconductor substrates during epitaxial deposition. In a preferred embodiment, the relief takes the form of a rectilinear recess, or cutout, formed along the bottom periphery of each pocket to change the single-point, tangential contact to a double-point contact that stabilizes the substrate supported thereon and that reduces slip formation characterizing conventional, unrelieved pockets formed in barrel-type reactors such as susceptors. The invention lends itself to design and manufacture of such reactors as well as retrofit of an existing installed base of conventional reactors.

11 Claims, 3 Drawing Sheets

SUSCEPTOR APPARATUS FOR EPITAXIAL DEPOSITION AND METHOD FOR REDUCING SLIP FORMATION ON SEMICONDUCTOR SUBSTRATES

TECHNICAL FIELD

The present invention relates generally to susceptors for semiconductor substrates undergoing thermal epitaxial deposition or other processing. More particularly, it concerns a unique substrate-support pocket configuration that reduces slip formation and thus increases wafer and integrated circuit (IC) yield.

BACKGROUND ART

Typically, semiconductor wafers are placed within pockets formed in an outer surface of a hollow polyhedral susceptors, also referred to herein as barrel-type susceptors. Various diameters and numbers of wafers are accommodated by the pockets in which the wafers rest. The substrates are in contact with the susceptor pockets on their rear sides and with the pockets' recesses in their lower extremities. Stress results typically from such contact, particularly in the area of the pockets' recesses, and such stress forms slip that tends to migrate from the wafers' peripheries into the useful, circuit-worthy regions thereof.

DISCLOSURE OF THE INVENTION

Briefly, the invented apparatus and method provide relief in a center bottom region of each of a plurality of recessed pockets for supporting a semiconductor substrates during epitaxial deposition. In a preferred embodiment, the relief takes the form of a rectilinear recess, or cutout, formed along the bottom periphery of each pocket to change the single-point, tangential contact to a double-point contact that stabilizes the substrate supported thereon and that reduces slip formation characterizing conventional, unrelieved pockets formed in barrel-type reactors such as susceptors. The invention lends itself to design and manufacture of such reactors as well as retrofit of an existing installed base of conventional reactors.

These and additional objects and advantages of the present invention will be more readily understood after consideration of the drawings and the detailed description of the preferred embodiment which follows.

DETAILED DESCRIPTION OF THE PREFERRED EMBODIMENT AND BEST MODE OF CARRYING OUT THE INVENTION

Figure 1:
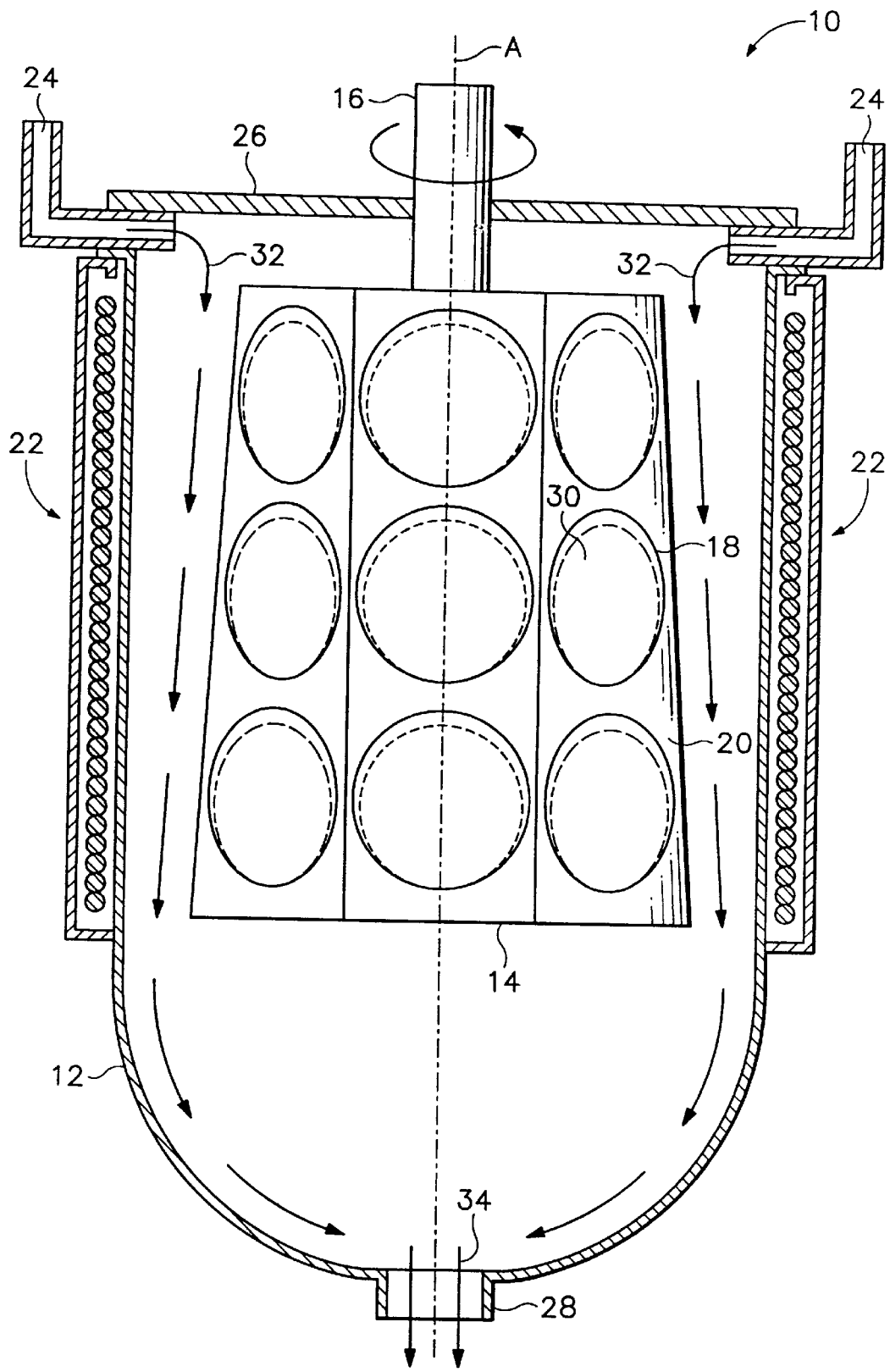
FIG. 1 is a simplified front elevational view of a prior art cylindrical apparatus for the deposition of epitaxial layers.

Referring first to FIG. 1, a typical prior art apparatus for epitaxial layer deposition is indicated in a simplified front elevational view at 10. Prior art apparatus 10 will be understood by those of skill in the art to include a bell jar 12 and a so-called barrel-type reactor, or polyhedragonal (i.e. hollow polyhedral) susceptor 14 mounted on a rotational shaft 16 inside bell jar 12 for rotation of susceptor 14 therewithin about a central, preferably vertical axis A. Susceptor 14 typically includes generally piano-circular, recessed pockets 18 formed on individual polyhedragonal, planar facets 20, as shown. Typically, prior art apparatus 10 further includes a heater 22, an inlet port 24 to permit entry to the interior of bell jar 12 of process gases, a top plate 26 to hermetically seal the interior of bell jar 12 and an exhaust port 28 for the discharge of spent process gases.

Those of skill in the art will appreciate that epitaxial deposition involves placing semiconductor substrates 30, typically wafers of generally plano-circular configuration, into slightly larger-diameter, recessed pockets 18 of susceptor 14 and energizing heater 22 to elevate the temperature of susceptor 14 and substrates 30 within bell jar 12 while susceptor 14 is rotated by driving shaft 16. Meanwhile, raw material process gases indicated generally at 32 are introduced through inlet port 24 into the interior of bell jar 12 where they react with semiconductor substrates 30 to grow an epitaxial layer onto the substrates or wafers. Spent process gases and reaction by-products in the form of exhaust gases, indicated generally at 34, are discharged through exhaust port 28.

Figure 2:
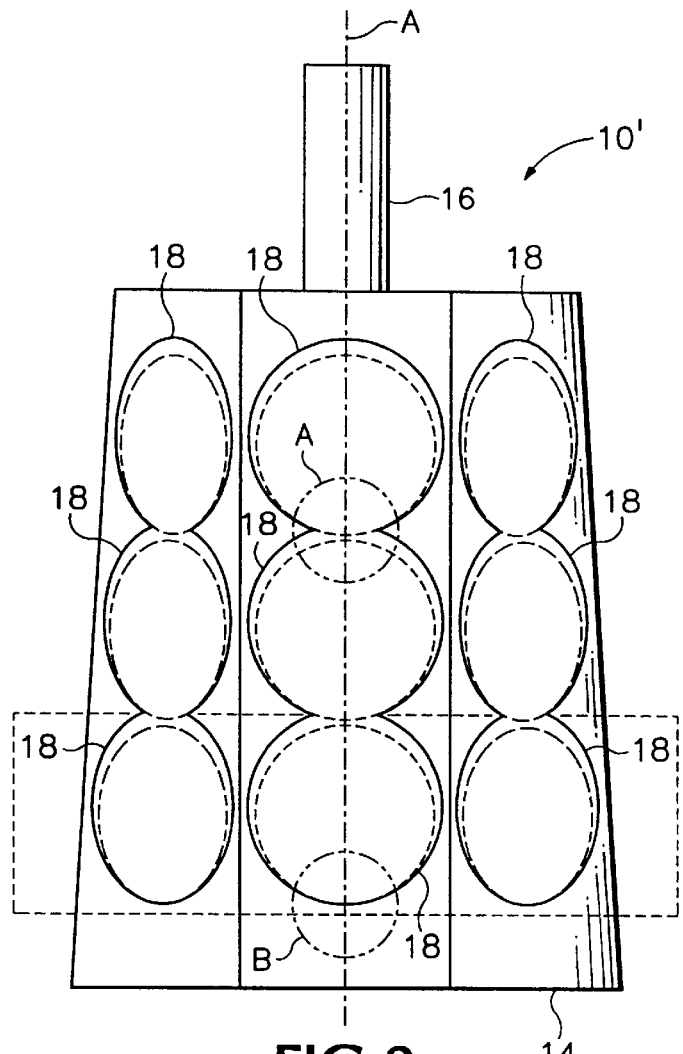
FIGS. 2, 2A and 2B are a simplified front elevational view similar to that of FIG. 1, but showing an alternative, overlapping-pocket configuration of the prior art apparatus detailed in the enlarged corresponding views of FIGS. 2A and 2B.

Referring briefly now to FIGS. 1 and 2, those of skill will appreciate that recessed pockets 18 typically are positioned either separately from one another, as shown in FIG. 1, or in slightly overlapping relationship with one another, as shown in FIG. 2. In either case, at least those pockets 18 on the bottom row, as may be seen, provide only single (tangential) point contact with substrates 30 resting therein, and in the non-overlapping pockets configuration shown in FIG. 1 all pockets exhibit such single point contact with their corresponding substrates 30.

The single-point contact between a lower, generally circular edge of a substrate 30 and a lower, generally circular support region of a pocket 18 inherently tends to produce slip at the substrate/susceptor interface. Such slip formation exists because, as temperatures within bell jar 12 are raised and lowered during epitaxial deposition, different thermal expansion coefficients and temperature gradient variations between substrates 30 and susceptor 14 cause stress at the substrate/susceptor interface. Even with the overlapping-pockets configuration shown in FIG. 2, there is nevertheless undesirable slip formation at least in the bottom row of pockets, which pockets exhibit such single-point contact between substrate 30 and susceptor 14.

Figure 2A:
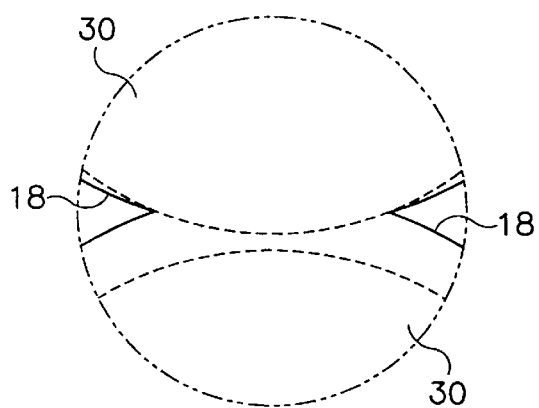
Figure 2B:
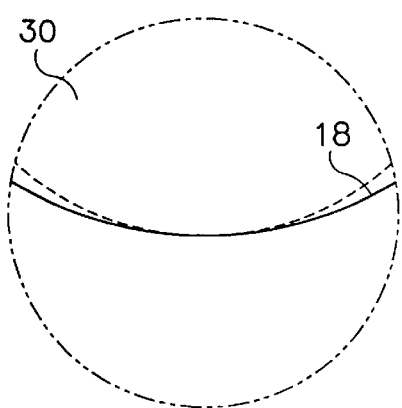

Turning now collectively to FIGS. 2, 2A and 2B, the above briefly-described, alternative configuration of the prior art, non-overlapping pocket apparatus of FIG. 1 is indicated, also in simplified front elevational view, at 10'. It may be seen readily from FIGS. 2, 2A and 2B (which correspond with dash-dot outlined details A, B of FIG. 2) that pockets 18 along the bottom row, which in FIG. 2 is dash outlined, exhibit the single-point contact along their center-bottom periphery where they support substrates 30. Thus, it will be appreciated by those skilled in the art that the same problem of slip formation exists at least along the bottom row of the one or more recessed pockets in all known prior art susceptor apparatus.

Figure 3:
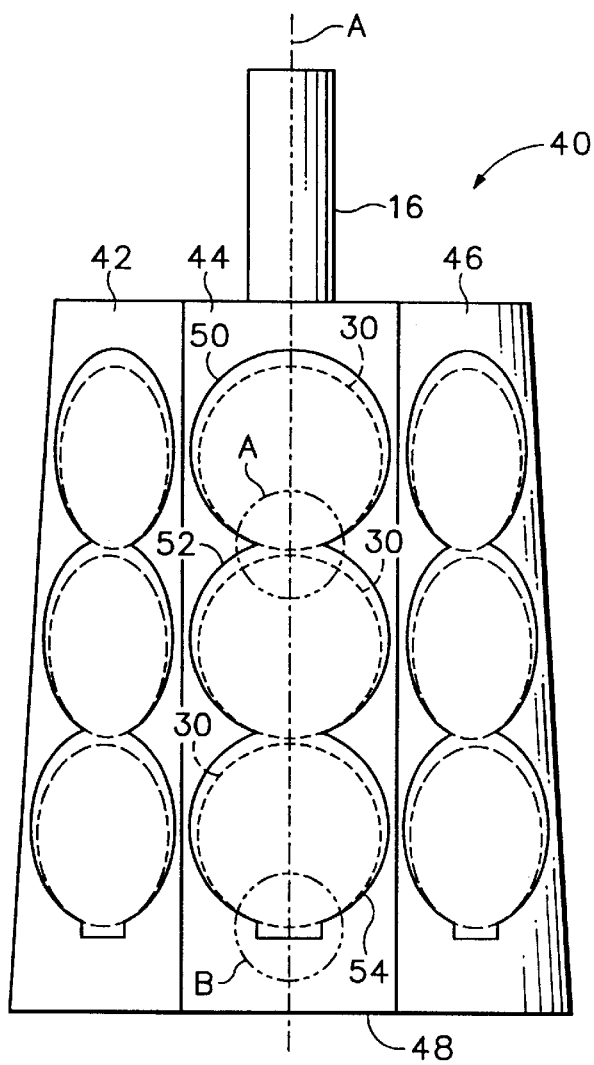
FIGS. 3, 3A and 3B are a simplified front elevational view of the invented apparatus, showing in the enlarged corresponding views of FIG. 3A, which represents a prior art, overlapping-pocket configuration similar to that of FIG. 2A, and FIG. 3B, which represents a novel pocket configuration, including certain novel details of the invention.
Figure 3A:
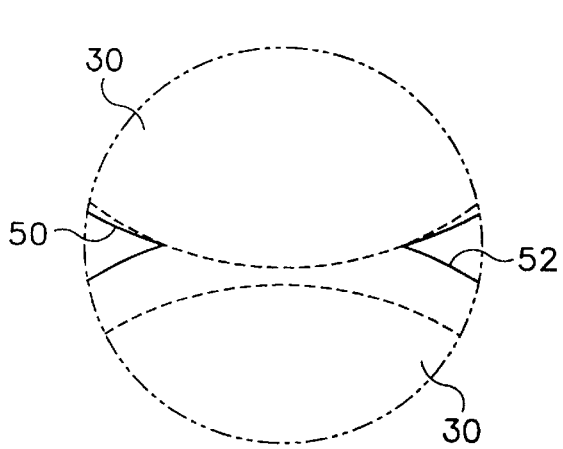
Figure 3B:
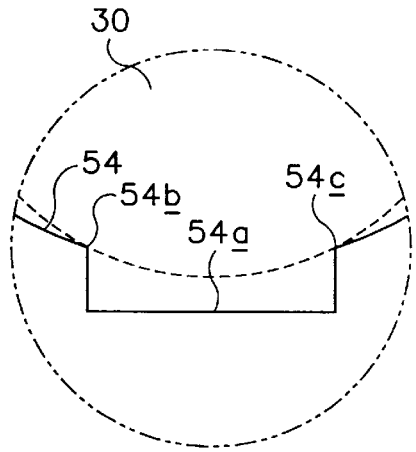

Turning now collectively to FIGS. 3, 3A and 3B, the invented apparatus is shown in a simplified front elevational view at 40. It will be appreciated that apparatus 40 forms only a part of an otherwise conventional, cylindrical apparatus as described in connection with FIG. 1 above including a bell jar and the attendant heater, inlet port, top plate and exhaust port. For the sake of clarity and brevity, only the invented rotatable polyhedragonal susceptor apparatus made in accordance with invention—for supporting preferably plural, conventional semiconductor substrates 30—will be further described and illustrated herein.

Invented susceptor apparatus 40 will be understood, in accordance with its preferred embodiment, to include five planar facets (of which only three—facets 42, 44, 46—are visible) configured generally in a closed, pentagonal configuration, with each facet extending slightly frustoconically about a central axis A to form what is referred to herein generally as a cylinder 48. Preferably cylinder 48 is formed integrally, as by molding, of graphite or other suitably durable, chemically and atmosphericaly inert, material. As may be seen, each facet preferably is provided with a plurality of, e.g. three, overlapping recessed pockets 50, 52, 54 arrayed lengthwise in a collinear configuration along the outer surface thereof. It will be understood that the recessed pockets are generally plano-circular and are recessed to a predefined depth that permits them to support semiconductor substrates 30 therein, as shown. It also will be understood that any number and relative placement of such recessed pockets per facet, as well as any number and relative placement of facets, may be provided, within the spirit and scope of the invention.

Referring still to FIG. 3, it may be seen that two of the pockets, e.g. top and middle pockets 50, 52 preferably are of conventional, overlapping relative configuration and generally circular shape, as is described above in connection with FIGS. 2 and 2A. Importantly, however, bottom pocket 54 may be seen to have a slightly different shape that, while generally circular, provides an important advantage over conventional bottom pockets. Broadly speaking, the bottom center of the circular recess in such bottom row is relieved, e.g. recessed, to increase the number of point contacts between the pocket and the circular edge of a substrate supported therein.

The invention may be understood from FIG. 3 and more particularly FIG. 3B (which corresponds with detail B of FIG. 3) to represent a useful improvement to the conventional, generally circular pockets formed in susceptors for epitaxial deposition on generally circular semiconductor substrates wherein the pockets support the substrate at a point of tangential contact therebetween. The improvement preferably takes the form of structure such as a relief or recess 54a in the lower region of the pocket for supporting the substrate at at least two points 54b, 54c of contact between the substrate and the pocket. Preferably, recess 54a is rectilinear (and is dimensioned, for example, to be approximately 1.0-inches wide and deep enough to avoid single-point tangential contact with the smallest-diameter substrate), as best shown in FIG. 3B, although those of skill will appreciate that the recess may be any suitable contour, e.g. curvilinear, that produces double contact points such as points 54b, 54c.

In accordance with a preferred embodiment of the invention in which conventional susceptors may be retrofitted with the advantages of the present invention, recess 54a may be formed as a cutout that extends beneath the lower region of the generally circular pocket. It will be appreciated that any means of forming structure 54a, whether by design or retrofit, is envisioned as being within the spirit and scope of the invention. For example, instead of a recess, structure 54a may take the form of a pair of spaced bosses that extend inwardly from nominal center bottom region of pocket 54. FIG. 3A (which corresponds with detail A of FIG. 3) will be understood to be very similar to FIG. 2A, as it represents a prior art configuration of overlapping top and middle pockets 50, 52, the latter of which provides relief for the former.

It will be appreciated that the combination of prior art, overlapping pockets 50, 52 with novel pocket 54, as illustrated, within invented susceptor apparatus 40 is believed to be novel and to be within the spirit and scope of the invention. It will also be appreciated that novel pocket 54 having the relief described and illustrated herein may be usefully employed in any or all pocket positions of prior art, non-overlapping pockets susceptors such as susceptor 14 of FIG. 1, also within the spirit and scope of the invention.

By forming spaced double point contacts between the substrate and the recessed pocket, the substrate is supported within the pocket in a more stable configuration that resists rocking of the substrate within the pocket during rotational acceleration or inadvertent vibration. Moreover, it is believed that the sharper the point contact between the edge of the substrate and the bottom edge of the recess, the more resistant the interface to undesirable slip formation. As used herein, point contact is a helpful geometric concept but it will be appreciated that slightly rounded 'point' contacts are contemplated in practice and are within the spirit and scope of the invention.

Another way of thinking about the invented apparatus is as a susceptor for use in epitaxial deposition on a generally circular semiconductor substrate, the susceptor including a hollow polyhedral structure having plural facets, at least one of the facets having a generally vertical array of plural generally circular pockets including a bottom pocket, and a recess formed within a lower region of the bottom pocket, the recess for supporting the substrate at at least two points of contact between the substrate and the bottom pocket.

In accordance with the preferred embodiment of the invention illustrated in FIGS. 3, 3A and 3B, it may be seen that five planar facets are provided in a pentagonal cross-sectional configuration, with each facet including three overlapping pockets. Of course, any suitable number of facets and pockets may be provided within the spirit and scope of the invention. It may be seen to be preferable from a cost standpoint that the hollow polyhedral, or polyhedragonal, structure may be integrally formed, with the pockets integrally formed therewith although within the spirit and scope of the invention, any suitable structure formed in any suitable manner having suitably relieved pockets as claimed is within the scope of the invention. Finally, the preferably integral structure preferably is made of graphite, although other suitable materials may be used.

The invented method now may be understood, in light of the invented apparatus described above. The invented method reduces slip formation during epitaxial deposition on a generally circular semiconductor substrate, as described above. The invented method is useful in connection with susceptors having at least a bottom one of recessed, substrate-supporting, generally circular pockets formed therein wherein the pocket provides tangential, single-point-contact support of the substrate. Importantly, the invented method involves relieving a region along the nominal center bottom arcuate support region of the pocket thereby to increase the number of contact support points from singular to plural, e.g. from one to two. Preferably, the relieving step includes forming a preferably rectilinear recess within the nominal center bottom arcuate support region of the pocket such that the substrate is supported on at least two contact support points, as best illustrated in FIG. 3B, although as noted above any suitable shape of recess is contemplated and is within the spirit and scope of the invention.

INDUSTRIAL APPLICABILITY

It may be seen, then, that the invented method and apparatus find broad applicability in the manufacture of semiconductor-based products, and provide the advantages of increased yield by reducing slip formation that has plagued semiconductor wafer epitaxial deposition. As noted above, barrel-type reactors such as susceptors that support semiconductor substrates during such deposition may be designed and manufactured with the invented relief near a center bottom of each recessed pocket, or conventional barrel-type reactors may be retrofitted in accordance with the teachings herein. Yet the invented method and apparatus are inexpensive and straightforwardly implemented to obtain the described utility and advantages.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

We claim:

1. A susceptor for use in epitaxial deposition on a semiconductor substrate, the susceptor comprising;

a structure having at least one face, at least two pockets arranged generally vertically in said face, including a bottom pocket, each pocket being configured to accommodate a semiconductor substrate, and at least two contact points formed within said bottom pocket and generally at the bottom of said bottom pocket, said contact points being configured to support the substrate at at least two points of contact between the substrate and said bottom pocket.

2. The susceptor of claim 1 in which the bottom pocket is generally circular, and wherein said contact points are formed from a generally rectilinear recess.

3. The susceptor of claim 1, wherein said contact points are formed by a cutout that extends beneath the bottom of said bottom pocket.

4. The susceptor of claim 1, wherein said faces number five and said pockets number three per face.

5. The susceptor of claim 1, wherein at least two pockets overlap one another.

6. The susceptor of claim 1, wherein said structure is integrally formed with said pockets integrally formed therein.

7. The susceptor of claim 1, wherein said structure is formed of a graphite material.

8. The susceptor of claim 1, wherein the bottom pocket has an arcuate bottom edge configured to support a semiconductor substrate, and where the contact points are formed by a recess in the arcuate bottom edge.

9. A susceptor for use in an epitaxial barrel type reactor, the susceptor comprising:

a hollow polyhedral structure having a plurality of outwardly facing facets, a plurality of pockets in each facet, where the pockets are arranged generally vertically in each facet, where one of the pockets in at least one of the facets is a bottom pocket, where the bottom pocket includes a back surface and a bottom edge, and where the back surface and bottom edge of the bottom pocket are configured to support a semiconductor substrate in the bottom pocket, and two points in the bottom edge of the bottom pocket to contact and support a semiconductor substrate in the bottom pocket.

10. The susceptor of claim 9 wherein the two points are configured to support a semiconductor substrate having a face and an edge, and where the two points support the semiconductor substrate by contacting the edge of the substrate without overlapping the face of the substrate.

11. A susceptor for use in epitaxial deposition with a semiconductor substrate that has a face, a back and an edge, the susceptor comprising:

a structure having at least one face, and at least two pockets in the face, where the pockets are arranged generally vertically in the face, where the pockets include a bottom pocket, and where the bottom pocket includes a back surface and an edge having at least two contact points, where the back surface of the pocket is configured to support the semiconductor substrate by contacting the back of the semiconductor substrate, and where the contact points are configured to support the semiconductor substrate by contacting the edge of the semiconductor substrate without overlapping the face of the semiconductor substrate.

* * * * *